United States Patent
Chen et al.

(10) Patent No.: US 7,400,696 B2
(45) Date of Patent: Jul. 15, 2008

(54) SPREAD SPECTRUM CLOCK GENERATOR AND METHOD OF GENERATING SPREAD SPECTRUM CLOCK

(75) Inventors: Chia-Ping Chen, Taipei (TW);
Chin-Yang Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 631 days.

(21) Appl. No.: 11/093,450

(22) Filed: Mar. 30, 2005

(65) Prior Publication Data

US 2006/0056562 A1  Mar. 16, 2006

Related U.S. Application Data

(63) Continuation-in-part of application No. 10/939,073, filed on Sep. 10, 2004, now Pat. No. 7,313,161.

(51) Int. Cl.
*H03D 3/24* (2006.01)
(52) U.S. Cl. ..................................... 375/376
(58) Field of Classification Search ................. 375/130, 375/135, 136, 146, 147, 376; 327/148, 157, 327/158, 161, 153, 149, 141, 147, 162, 261; 331/1 A, 78
See application file for complete search history.

(56) References Cited

U.S. PATENT DOCUMENTS 5,488,627 A  1/1996 Hardin et al.
5,631,920 A  5/1997 Hardin
5,867,524 A  2/1999 Booth et al.
5,872,807 A  2/1999 Booth et al.
2003/0057449 A1 *  3/2003 Hirabayashi ................ 257/200
2004/0085108 A1 *  5/2004 Murata et al. ................ 327/158

FOREIGN PATENT DOCUMENTS

WO  WO 03019783  3/2003

OTHER PUBLICATIONS

Spread spectrum definition, Glossary—CNET.com, http://www.cnet.com/Resources/Info/Glossary/Terms/spreadspectrum.html, accessed Jun. 4, 2004.
Spread spectrum definition, Wikipedia, the free encyclopedia, http://en.wikipedia.org/wiki/Spread-spectrum, accessed Jun. 4, 2004.
Dr. Ki Wing-Hung et al., Integrated Circuit Design for Analog Decoder, Final Year Project (2002-2003) Project Poster, 4 pages.
Kamaran Iravani et al., "VCOs with Very Low Sensitivity to Noise on the Power Supply," IEEE 1998 Custom Integrated Circuits Conference, pp. 515-518.
Ian A. Young, A PLL Clock Generator with 5 to 110 MHz of Lock Range for Microprocessors IEEE Journal of Solid-State Circuits, vol. 27, No. 11, Nov. 1992.

* cited by examiner

*Primary Examiner*—Sam K Ahn
(74) *Attorney, Agent, or Firm*—Duane Morris LLP

(57) ABSTRACT

A clock circuit for generating a spread spectrum clock signal with reduced amplitude electromagnetic interference (EMI) spectral components is provided where the clock circuit includes a delay line circuit, the delay line circuit providing a spread spectrum clock signal from a reference clock signal in response to a modulation signal, a delay of said delay line circuit being controlled by said modulation signal.

18 Claims, 10 Drawing Sheets

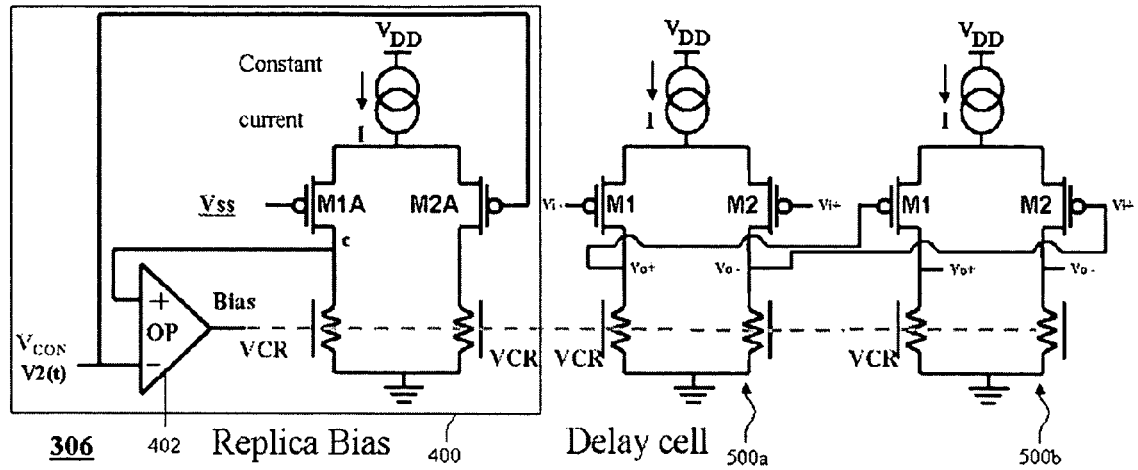
FIG. 11
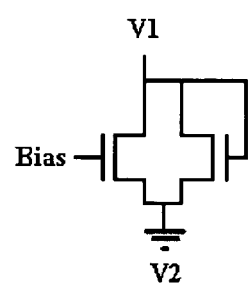 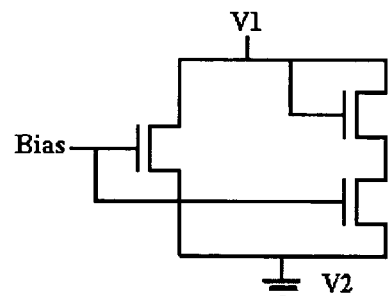
FIG.12(a)   FIG.12(b)

… (US 7,400,696 B2)

SPREAD SPECTRUM CLOCK GENERATOR AND METHOD OF GENERATING SPREAD SPECTRUM CLOCK

CROSS-REFERENCE TO RELATED APPLICATION

This application claims priority to and is a continuation-in-part of U.S. patent application Ser. No. 10/939,073, entitled "Spread Spectrum Clock Generator and Method of Generating Spread Spectrum Clock" filed Sep. 10, 2004, which issued as U.S. Pat. No. 7,313,161, the entirety of which is hereby incorporated by reference herein.

FIELD OF THE INVENTION

The present invention relates to clock circuits having reduced measurable electromagnetic interference (EMI) emissions, and more specifically to spread spectrum clock circuits and methods of generating spread spectrum clock signals.

BACKGROUND OF THE INVENTION

Many electronic devices employ microprocessors or other digital circuits that require one or more clock signals for synchronization and other functions. A clock signal permits precise timing of events in the microprocessor, for example. Typical microprocessors may be supervised or synchronized by a free-running oscillator, such as an oscillator driven by a crystal, an LC-tuned circuit or an external clock source. Clocking rates up to 40 MHz, 66 MHz, 100 MHz, 133 MHz, 200 MHz and beyond are common in personal computers. The parameters of a clock signal are typically specified for a microprocessor and may include minimum and maximum allowable clock frequencies, tolerances on the high and low voltage levels, maximum rise and fall times on the waveform edges, pulse-width tolerance if the waveform is not a square wave and the timing relationship between clock phase if two-clock phase signals are needed.

High performance microprocessor-based devices using leading edge, high-speed circuits are particularly susceptible to generating and radiating electromagnetic interference (EMI). The spectral components of the EMI emissions typically have peak amplitudes at harmonics (i.e., whole number multiples) of the fundamental frequency of the clock circuit. Accordingly, many regulatory agencies, such as the FCC in the United States, have established testing procedures and maximum allowable emissions for such products.

Practical synchronous digital systems radiate electromagnetic energy in a number of narrow bands at the clock frequency and its harmonics, resulting in a frequency spectrum that, at certain frequencies, can exceed regulatory limits for electromagnetic interference. In order to comply with government limits on EMI emissions, costly suppression measures or extensive shielding may be required. Other approaches for reducing EMI include careful routing of signal traces on printed circuit boards to minimize loops and other potentially radiating structures. Unfortunately, such an approach often leads to more expensive multilayer circuit boards with internal ground planes. In addition, greater engineering effort must go into reducing EMI emissions. The difficulties caused by EMI emissions are made worse at higher processor and clock speeds.

An alternative approach is to reduce the spectral density of the EMI by lowering the peak energy emissions at harmonics using a spread spectrum clock signal. This approach consists of modulating the frequency of the clock signal by either a regular function such as a triangular wave or by a pseudo-random function. This method distributes the energy of the clock signal over a wider frequency range, thereby reducing its peak spectral density. This procedure works because the EMI receivers used by testing laboratories divide the electromagnetic spectrum into frequency bands approximately 120 kHz wide. If the system under test were to radiate all of its energy at one frequency, then this energy would fall into a single frequency band of the receiver, which would register a large peak at that frequency. Spread spectrum clocking distributes the energy so that it falls into a large number of the receiver's frequency bands, without putting enough energy into any one band to exceed the statutory limits.

FIG. 1 is a schematic illustration of this effect where the spectral amplitude versus frequency at a harmonic (NF) is indicated by the plot labeled M. As also shown, the spectrum at the harmonic of a standard clock signal is given as an impulse function labeled I. The spectrum of the spread spectrum clock signal at the same harmonic frequency ideally assumes a trapezoidal shape as illustrated by the plot labeled T.

FIG. 2 is a block diagram of a spread spectrum clock generator circuit 10 including a phase locked loop (PLL), such as proposed in U.S. Pat. Nos. 5,488,627, 5,631,920, 5,867,524 and 5,827,807, the entirety of which are hereby incorporated by reference herein. The PLL 10 includes a first frequency divider 12, a phase detector 14, low pass filter 16, voltage controlled oscillator 18 and second frequency divider 20. The circuit 10 frequency modulates an externally generated clock signal designated "Ref", such as a signal generated by a piezoelectric crystal driven at its resonant frequency by a suitable driver or oscillator circuit, to provide a spread spectrum output clock signal CLK. The frequency modulation of the clock signal reduces spectral amplitude of the EMI components at each harmonic of the clock when compared to the spectrum of the same clock signal without modulation.

Although the spread spectrum clock signal circuit 10 can reduce the EMI emissions in an electronic device, the modulation is done through a complex PLL circuit as illustrated. Further, the output clock signal is mostly influenced by the phase noise of the oscillator circuit 18 but not the reference signal Ref. The reference signal passes through the VCO 18 and is fed back through the phase detector 14. If the reference signal is a very high frequency input and the phase noise of the VCO 18 is not proper with respect to the high frequency reference signal, the VCO 18 will influence the precision of the output clock signal.

Therefore, there remains a need for a less complex circuit and method for generating a spread spectrum clock signal. Still further, there remains a need for a circuit and method for generating a spread spectrum clock signal with improved phase noise.

SUMMARY OF THE INVENTION

A clock circuit for generating a spread spectrum clock signal with reduced amplitude electromagnetic interference (EMI) spectral components is provided where the clock circuit includes a delay line circuit, the delay line circuit providing a spread spectrum clock signal from a reference clock signal in response to a modulation signal, a delay of said delay line circuit being controlled by said modulation signal.

In another embodiment, an electronic device comprising a clock circuit for generating a spread spectrum clock signal is provided comprising a voltage controlled delay line circuit, the delay line circuit providing a spread spectrum clock signal from a reference clock signal in response to a modulation signal, a delay of the delay line circuit being controlled by said modulation signal, and a first integrator, the first integrator providing the modulation signal in response to a first input signal.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which:

FIG. 11 illustrates an exemplary voltage controlled delay line of the clock generator of FIG. 9;

FIGS. 12(a) and 12(b) are circuit diagrams of exemplary voltage controlled resistors;

DETAILED DESCRIPTION

Figure 1:
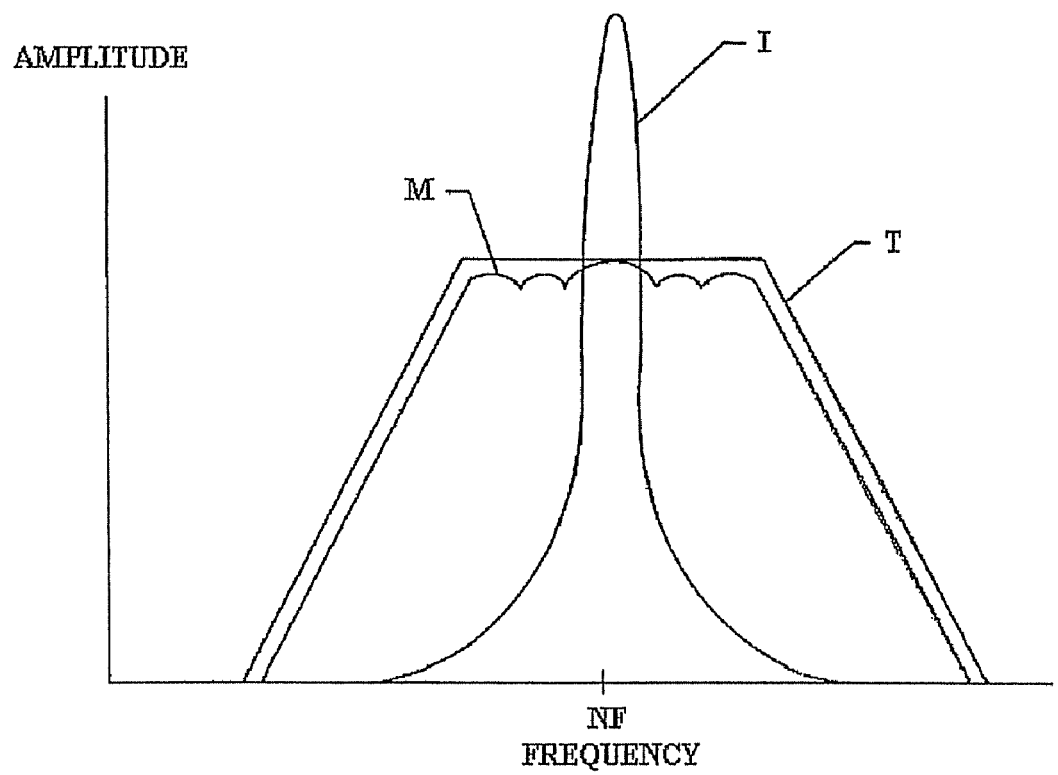
FIG. 1 is a schematic illustration and comparison of the spectral amplitude of a non-spread spectrum clock signal and a spread spectrum clock signal at a harmonic frequency.
Figure 2:
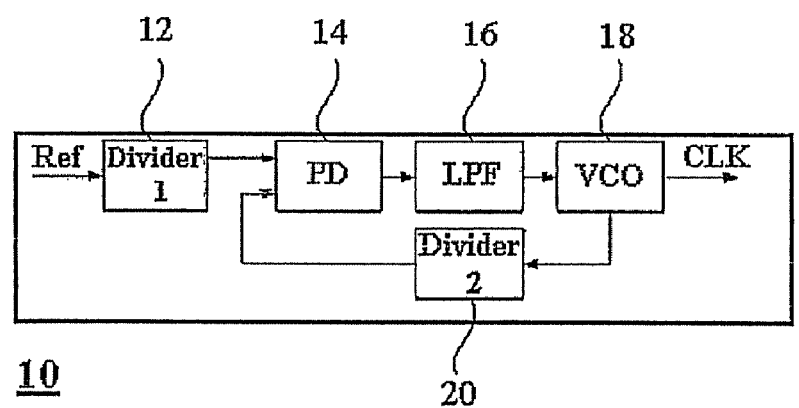
FIG. 2 is a block diagram of a prior art circuit for generating a spread-spectrum clock signal.
Figure 3:
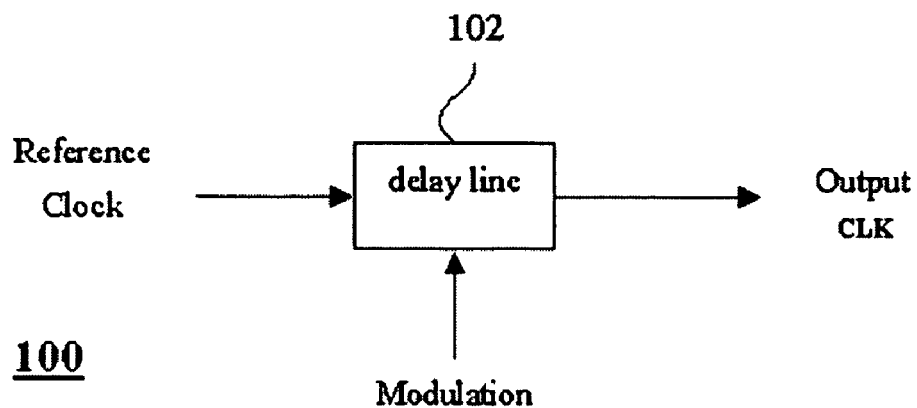
FIG. 3 is a block diagram of a spread spectrum clock signal generator utilizing a delay line.

FIG. 3 is a block diagram of a spread spectrum clock signal generator 100 for reducing the peak spectral content of a clock signal, thereby limiting electromagnetic interference from electronic devices using the clock signal. In one embodiment, the clock signal generator 100 is formed in an integrated circuit included in, for example, a crystal oscillator, a microprocessor of a portable computer or other device. The clock signal generator includes a delay line 102 that provides a spread spectrum clock signal (labeled "Output CLK") from a Reference Clock signal (i.e., a series of clock pulses) and a modulation signal. In preferred embodiments, the delay line 102 is either a voltage controlled delay line or a current controlled delay. The generation of the spread spectrum clock signal is first mathematically described. Then, a specific embodiment 100A (FIG. 4, but not limited to this implementation) of a spread spectrum clock signal generator is described.

A reference clock signal having a frequency $W_o$ is provided to the delay line, which produces an output spread spectrum clock signal having a frequency W. The delay line receives a modulation signal having a frequency $W_m$ and a voltage amplitude $V_c$. For illustrative purposes, assume that the reference clock conforms to the equation $Sin(W_o \cdot t + \theta_o)$ where $\theta_o$ is the phase of the reference clock signal. The amplitude of the modulation signal is defined as follows: $V_c(t)=a \cdot Sin(W_m \cdot t)$ where "a" is a constant number and "t" is time. By using the modulation signal to control the delay time of the delay line, the phase of the output signal, i.e., $\theta(t)$, is equal to $W_o \cdot t + k \cdot V_c(t)$, where k is a constant. The modulation signal controls the delay time of the delay line by its voltage level. The delay time is in inverse proportion to the voltage level. The phase of the output signal is then: $\theta(t)=W_o \cdot t + a \cdot k \cdot Sin(W_m \cdot t)$. Frequency is the derivative of the phase signal, so $W(t)=d\theta/dt=W_o + a \cdot k \cdot W_m \cdot Cos(W_m \cdot t)$, which defines a spread spectrum output clock signal.

Figure 4:
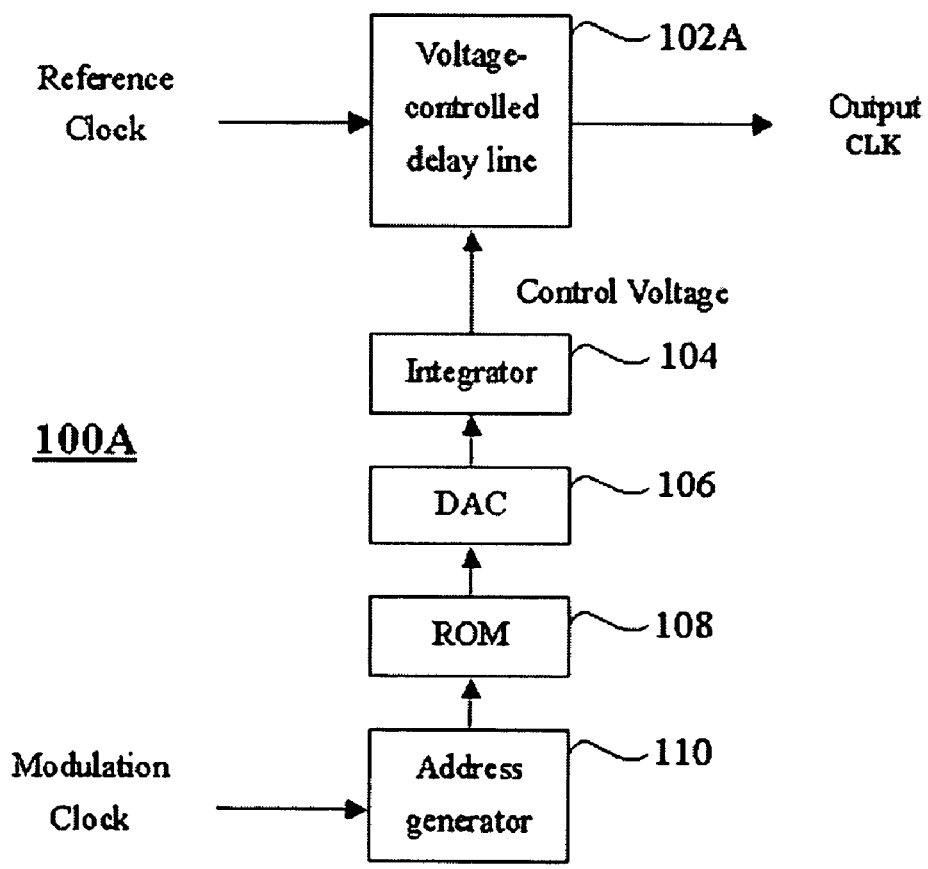
FIG. 4 is a block diagram of an embodiment of a spread spectrum clock signal generator.

Referring to FIG. 4, a preferred embodiment of a spread spectrum clock signal generator 100A is shown, although other embodiments may be utilized. The generator 100A includes a voltage controlled delay line 102A, which provides a spread spectrum clock signal in response to a reference clock signal and a control voltage signal. In one embodiment, the reference clock signal is a square wave at a frequency between about 40-200 MHz. The control voltage is generated by blocks 104-110 as described below.

A modulation clock signal is provided to address generator 110 to sample the address generator. In one embodiment, the modulation clock has a frequency of greater than or equal to about 28 kHz, and in one embodiment, between about 28 kHz and 1 MHz. The address generator 110 is a counter that repeats every $2^n$ times. The counter provides a new address value to the ROM 108 under control of the modulation clock (i.e., once per period of the modulation clock). In one embodiment, the address generator includes a lookup table, such as the following table, where n=3:

| | |
|---|---|
| 0 | ROM Address 0 |
| 1 | ROM Address 1 |
| 2 | ROM Address 2 |
| 3 | ROM Address 3 |
| 4 | ROM Address 4 |
| 5 | ROM Address 5 |
| 6 | ROM Address 6 |
| 7 | ROM Address 7 |

The first time that the modulation clock triggers the Address Generator 110, i.e., event "0", ROM Address 0 is provided to ROM 108. The eighth time that the modulation clock triggers the Address Generator 110, i.e., event "7", ROM Address 7 is provided to the ROM 108. The sequence then repeats itself, such that the ninth time that the modulation clock triggers the Address Generator 110, ROM Address 0 is again provided to the ROM 108, and so on.

Figure 5:
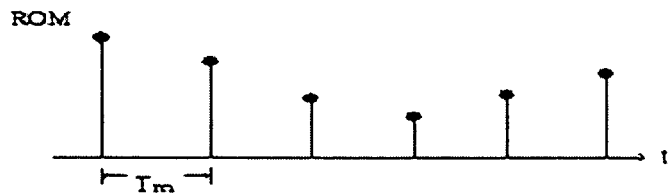
FIG. 5 illustrates sample data retrieved from the memory of the generator of FIG. 4.

ROM 108 has stored therein counting values pointed to by specific address values generated by Address Generator 110. The sampling rate depends on the period $T_m$ of the modulation clock. An example of values retrieved from ROM 108 is illustrated in FIG. 5. Every modulation clock period $T_m$, which is significantly longer than the reference clock period, a new value is retrieved from ROM 108. Although the modulation generation means is shown as including a ROM 108, other memory structure may also be used.

The data (i.e., counting values) in ROM 108 can be selected based on the desired modulation profile. Assuming a sinusoidal modulation profile and a counter cycle of 8 (i.e., n=8), the ROM content corresponds to [A·Sin(t0), A·Sin(t1) . . . A·Sin (t7)], where t0=0/4*pi, t1=1/4*pi, . . . t7=7/4*pi and A is a constant amplitude. For a triangular modulation profile, the ROM content corresponds to [0, A/2, A, A/2, 0, −A/2. −A, −A/2], where A is again constant and n=8. For a third order waveform modulation profile, the ROM content follows the following equation: $0.45 \cdot t^3 + 0.55 \cdot t$ in quarter cycles, also known as the optimized (Lexmark or Hershey Kiss) modulation, i.e., [−1, −0.33125, 0, 0.33125, 1, 0.33125, 0, −0.33125] for n=8.

Figure 6:
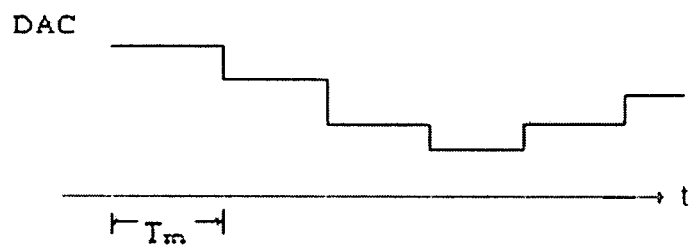
FIG. 6 illustrates an analog signal generated from the data of FIG. 5 with the DAC of FIG. 4.
Figure 7:
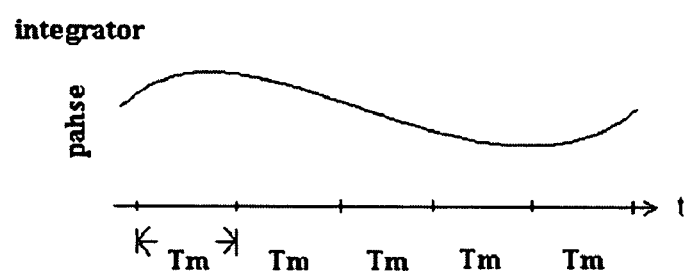
FIG. 7 illustrates a modulation signal provided by the integrator of FIG. 4 from the signal of FIG. 6.

The digital to analog converter (DAC) 106 converts the sampled data from the ROM 108 into an analog signal, such as the stepped analog signal shown in FIG. 6. The integrator 104 then integrates the analog signal provided by the DAC 106 to provide a phase signal as shown in, for example, FIG. 7 that changes phase with time. This phase signal, which has a complete period of $8*T_m$, is the modulation signal that controls the voltage controlled delay line 102A as described above. The signal exhibits a change in phase over time, as the phase θ is equal to $W_m \cdot t + \theta_o$. The product $W_m \cdot t$ varies with time period, resulting in a time dependent phase θ as shown in FIG. 7.

FIG. 4 illustrates a mixed analog and digital means of generating the modulation signal for controlling the delay of the delay line. It should be apparent, however, that the modulation signal can be generated by pure analog techniques. One advantage to the mixed digital/analog embodiment of FIG. 4 is that the data in ROM 108 can be reprogrammed, thereby providing added control over the delay of the delay line 102A and generation of the spread spectrum clock signal.

Figure 8:
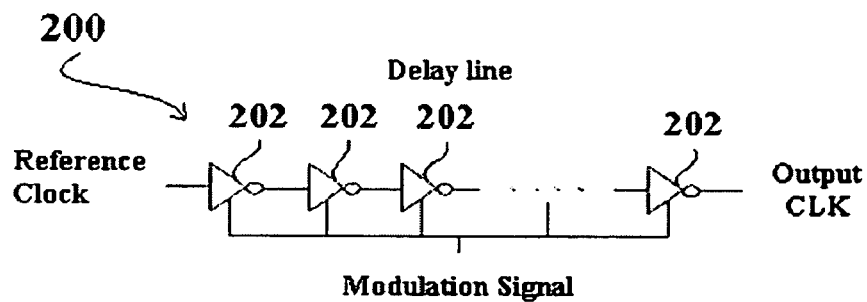
FIG. 8 illustrates an embodiment of the delay line of FIG. 4.

FIG. 8 illustrates an exemplary embodiment of a delay line 200. In this embodiment, the delay line 200 includes a plurality of series coupled inverters 202. The series of inverters receives the reference clock signal and each inverter 202 is coupled with the modulation signal. The series of inverters, with the total delay controlled by the modulation signal, provides an output signal corresponding to the spread spectrum clock signal.

Figure 8A:
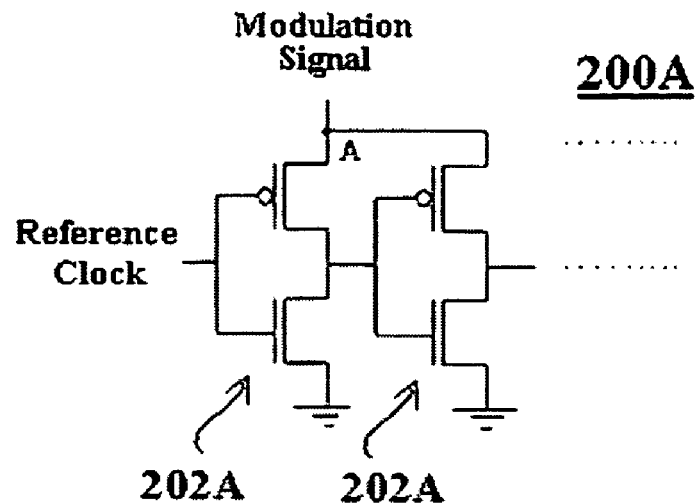
FIG. 8A is a more detailed illustration of the delay line of FIG. 8.

FIG. 8A provides a more detailed illustration of the delay line circuit of FIG. 8A. Delay line 200A comprises a plurality of inverters 202A coupled in series. The series of inverters receives the reference clock, and each inverter 202A comprises a pair of transistors coupled between a ground node and a node A, which receives the modulation signal. The voltage at node A, i.e., $V_A(t)$, controls the delay time of the delay line. The 1/(delay time) is linearly related to $V_A(t)$). The delay time constantly changes over the phase, $W_m \cdot t$. It is contemplated that an appropriately designed delay line could make the delay time linearly related to $V_A(t)$, if desired.

The delay line can comprise a voltage controlled delay line or a current controlled delay line, depending on what kind of signal is used to control the delay time of the delay line. The modulation signal may be a periodical current signal if the delay line is a current controlled delay line. The modulation signal may be a periodical voltage signal if the delay line is a voltage controlled delay line. Alternatively, a voltage-current or current-voltage converter can be used if the modulation signal is a voltage signal and the delay line is current controlled, or vice versa.

The spread spectrum clock signal generator described herein provides a spread spectrum clock signal without the need for a feedback signal. This approach to generating a spread spectrum clock signal does not suffer from the phase noise degradation problems attributed to the use of a voltage controlled oscillator with high frequency signals of prior art phase lock loop techniques. The approach described herein provides a low phase noise clock output with spread spectrum capability with simplified structure for generating the spread spectrum clock signal, with associated reductions in cost. The circuit can be used to provide a spread spectrum signal from a variety of clock signal sources, such as crystal oscillators, SAW oscillators, or other sources.

Figure 9:
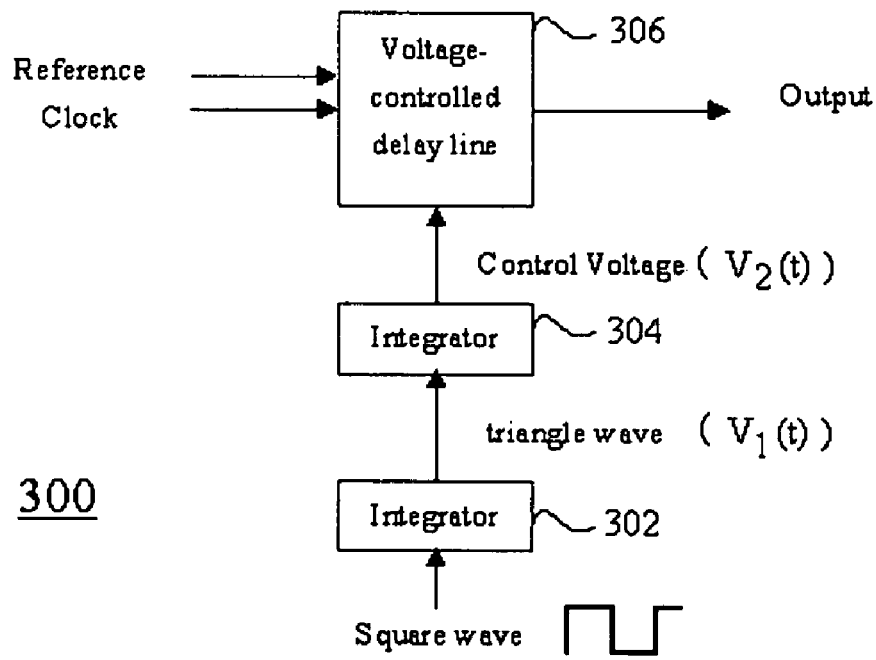
FIG. 9 is a block diagram of an alternative embodiment of a spread spectrum clock signal generator.

FIG. 9 illustrates an analog embodiment of the spread spectrum clock generator. As described hereafter, in a preferred embodiment, the clock generator 300 advantageously has a delay time in the voltage controlled delay line that is linearly related to the control voltage, as opposed to clock generator 100A of FIG. 4. With the control signal V2(t) described below, the delay Td of the delay line is proportional to 1/(Vdc+Vac), where Vdc is the DC component of the control signal and Vac is the AC component of the control signal. If Vac is a small signal in comparison to Vdc, then 1/(Vdc+Vac) approximates to 1/Vdc(1−Vac/Vdc). So, Td and Vac are linearly related.

Clock generator 300 of FIG. 9 includes integrator 302, integrator 304 and voltage controlled delay line 306. In this embodiment, integrator 302 receives a square wave and integrates the square wave to produce triangle wave V1(t) that conforms to the following equation: $V1(t)=A(4t/T_0+1)$ for times $-\frac{1}{2}T_0 \leq t < 0$; and $V1(t)=A(4t/T_0+1)$ for times $-\frac{1}{2}T_0 \leq t < 0$, where A is a constant, t is time, and $T_0$ is the period of the triangle and square waves. Of course, other input waveforms, such as a square wave, could be used depending upon the desired output waveform. The second integrator 304 integrates triangle wave V1(t) to produce control voltage V2(t) for controlling the voltage-controlled delay line 306. The control voltage V2(t) equals K*integral of V1(t), where K is a constant. Assuming for illustrative purposes that the reference clock conforms to the equation cos(Wo·t) (or sin (Wo·t+θ_o)), then the output of the delay line Vout(t)=A*cos (Wo·t−K*integral of V1(t)), wherein A is a constant. The output phase θ(t) of the output signal equals Wo·t−K*integral of V1(t). Therefore, the instant output frequency W(t) (i.e., dθ/dt)=Wo−K*V1(t), which defines a spread spectrum output clock signal.

Figure 9A:
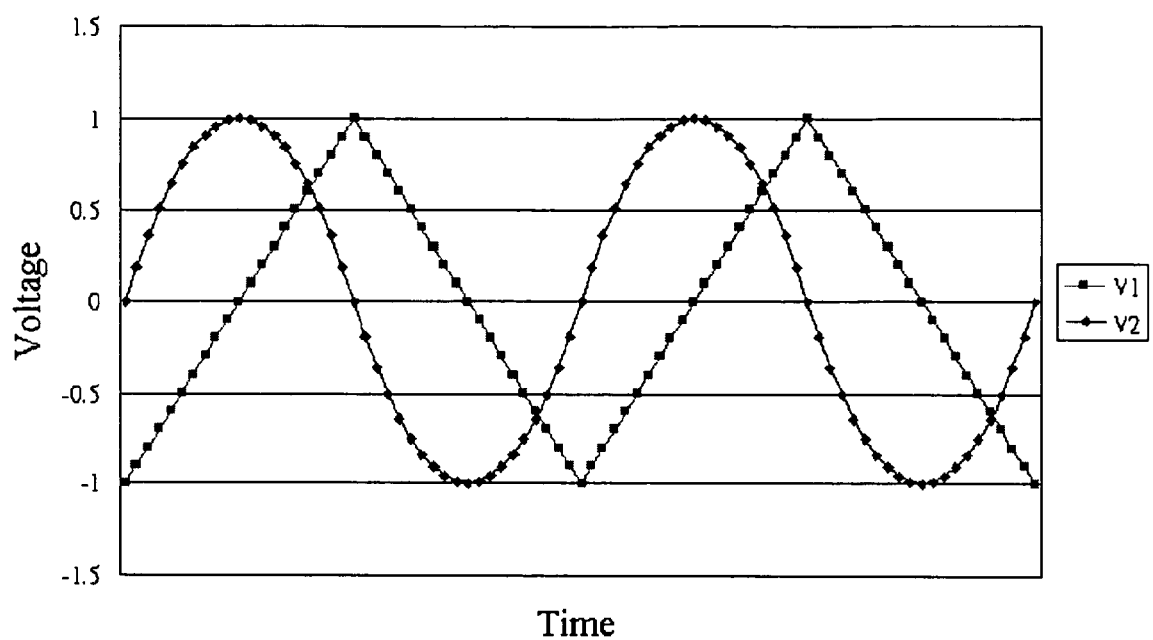
FIG. 9A is a graphical illustration of signals shown in the block diagram of FIG. 9.

FIG. 9A is a plot of signals V1(t), in the embodiment where V1(t) is a triangle wave, and V2(t), which is the integral of V1(t). It should be understood that the shape of V2(t) depends on the value of "K". The amount of spreading increases with the value of K. The value of K can be calculated by solving for K using the equations above. One of ordinary skill will understand that the value of K is set by the integrator 304 of FIG. 9. In the specific embodiment of FIG. 10 discussed below, the value of K changes with the value of the capacitor C2, i.e., as capacitance value of C2 increases, K decreases resulting in spreading decrease, and vice versa.

The Reference Clock is illustrated as having two inputs to the Voltage Controlled Delay Line 306, as many integrated circuits utilize two reference clocks, each being out of phase with the other by 180°. The delay line and control voltage operate on each component of the reference clock to provide a spread spectrum output clock having two components, each out of phase by 180°.

Figure 10:
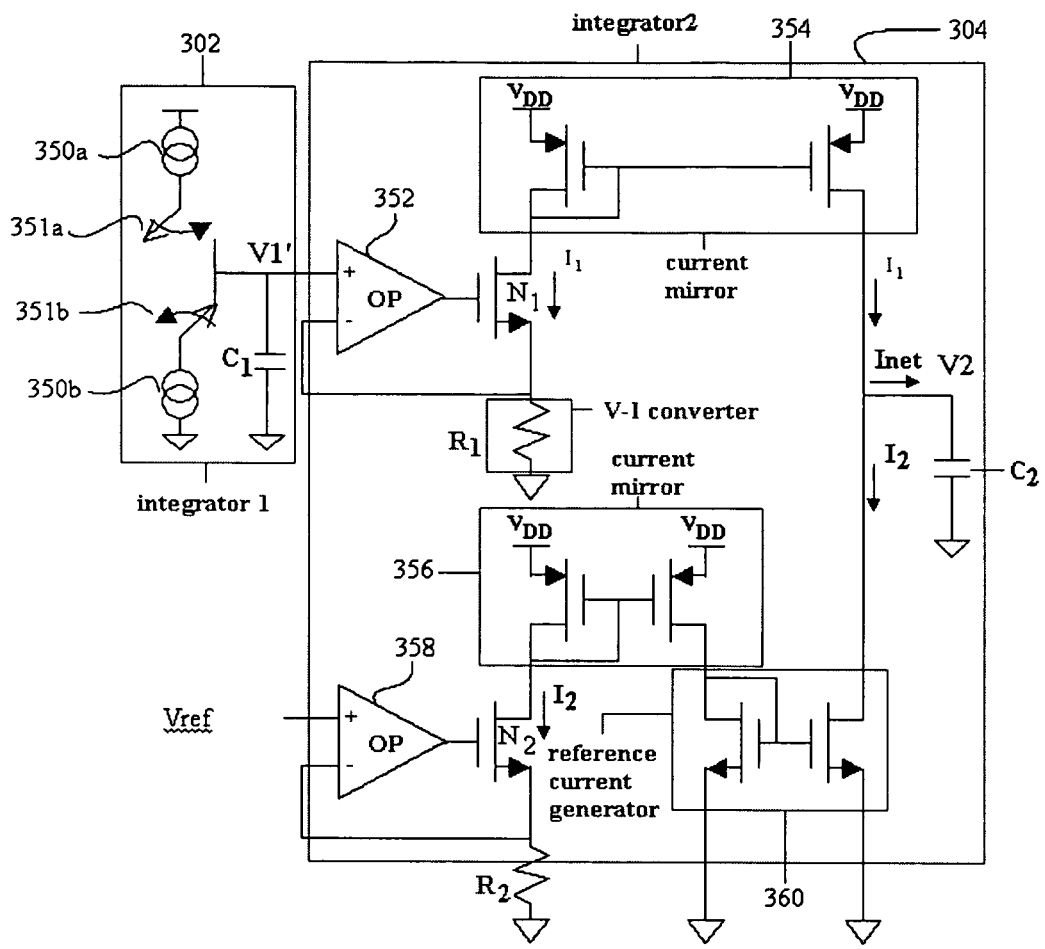
FIGS. 10 and 10A illustrate exemplary integrators of the clock generator of FIG. 9.

FIG. 10 is a circuit diagram of an exemplary embodiment of integrators 302 and 304 coupled together to provide the control voltage V2(t) for modulating the reference clock via delay line 306. In the illustrated embodiment, integrator 302 includes two current sources 350a, 350b coupled to switch means, which includes two counter-operating switches 351a, 351b, i.e., when one is opened, the other is closed and vice versa. The current sources 350a, 350b can take the form of a PMOS transistor and an NMOS transistor, respectively, biased at their control terminals to operate in saturation mode.

Figure 10A:
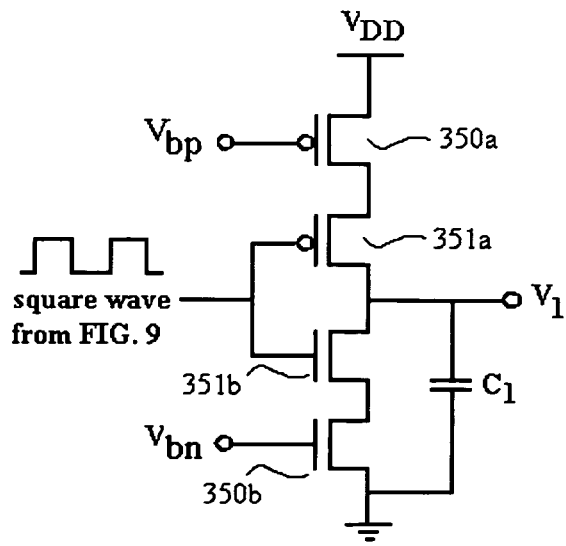

FIG. 10A illustrates the integrator 302 in more detail, with current sources shown as transistors 350a and 350b biased with Vbp and Vbn, respectively, and PMOS and NMOS switches 351a, 351b biased with the square wave described above in connection with FIG. 9. The capacitor C1 stores the charges from the two switches and functionally performs as an integrator. It is not believed that there is a frequency limitation on the square wave input, and in one preferred embodiment, the square wave has a frequency of 30 kHz.

In one embodiment, the second integrator 304 includes an operational amplifier 352 having a positive input coupled to node V1' (i.e., the output of integrator 302) and a negative node coupled to a voltage-to-current (V-I) converter. In this embodiment, the V-I converter comprises resistor R1. The output of operational amplifier 352 is coupled to NMOS transistor N1, which has a drain terminal coupled to resistor R1 and a source terminal coupled to current mirror 354. The integrator 304 also includes second operational amplifier 358 having a positive terminal coupled to Vref and negative terminal coupled to second resistor R2. Vref is preferably set to the average value of Voltage V1'. The output of operational amplifier 358 is also coupled to the control terminal of an NMOS transistor N2, which is likewise coupled to a current mirror 356. Current mirror 356 is coupled to a reference current generator 360. Both reference current generator 360 and first current mirror 354 are coupled to output node V2.

Integrator circuit 304 operates to provide current Inet, which is proportional to V1'(t)-Vref (i.e., V1 of FIG. 9). The inputs of OP Amp 352 are coupled to V1' and R1. Therefore, the voltage across R1 is pulled to V1'. The current that flows through R1 is I1, which is V1'/R1. This current I1 is mirrored by current mirror 354 and has both an AC and a DC component. Current mirror 356 provides current I2, which is Vref/R2 and which is a DC current. Reference current generator 360 mirrors current I2. Inet, which is equal to I1 minus I2, has no DC component and is provided for charging capacitor C2. Like C1, Capacitor C2 operates as an integrator. As explained above, current I1 and V1' are directly proportional. Therefore, Inet is directly proportional to V1' and V2 is the integral of V1 (i.e., to V1'-Vref).

In one embodiment, the capacitance of capacitor C1 equals 5 pF, the capacitance of capacitor C2 equals 50 pF and the resistance of resistors R1 and R2 equals 25 kΩ.

The control voltage V2(t) optionally can be used as the control voltage in the embodiments of FIGS. 3-4 described above, but a buffer may be necessary because it is designed for driving a capacitive load.

FIG. 11 is a circuit diagram of an exemplary embodiment of a voltage controlled delay line 306. In this embodiment, the delay line includes a replica bias stage 400 and one or more delay cells 500. In an exemplary embodiment, the delay cells 500 are differential delay cells as described in, for example, Ian A. Young, et al., "PLL Clock Generator with 5 to 110 MHz of Lock Range for Microprocessors," IEEE Journal of Solid-State Circuits, Vol. 27, pp. 1599-1607, November 1992, the entirety of which is hereby incorporated by reference herein. The replica bias stage 400 includes operational amplifier 402, which has a negative input terminal coupled to the control voltage (i.e., V2(t) provided by second integrator 304) and positive input terminal coupled to node C. The replica bias stage also includes a replica of the delay cells used for delay cells 500, which are based on PMOS source-coupled pairs with voltage-controlled resistor (VCR) load elements.

Each delay cell 500 is coupled between a negative or ground node and a constant current source, such as a transistor operating in saturation mode to provided constant current I. The control terminal of M2A of the delay cell of the replica bias stage 400 is coupled to the negative input of operational amplifier 402, and thus to control voltage V2(t), while the control terminal of M1A is coupled to operating voltage Vss or ground. The control terminal of each VCR is biased with the output of the operational amplifier 402. The Replica Bias Stage uses the op amp 402 and a copy of the delay cell to generate the appropriate bias to the VCRs as explained in more detail below.

Although familiar to those in the art, FIGS. 12(a) and 12(b) illustrate circuit diagrams for embodiments of voltage controlled resistors.

As explained above, each delay cell 500 includes a pair of source coupled PMOS transistors M1, M2 each coupled to a voltage controlled resistor (VCR) load biased with the output of operational amplifier 402. Each series combination is coupled between a constant current source and a ground or negative terminal. The control terminals of M1 and M2 of each delay cell 500 are coupled to receive differential signals that are 180° out-of-phase with each other. If one signal is high, the other signal is low, and vice versa. For the first delay cell 500a, Vi- and Vi+ are coupled to receive the two out-of-phase components of the reference clock REF CLK of FIG. 9. Each subsequent delay cell 500 (e.g., cell 500b, etc.) is then coupled to the output of the previous delay cell 500. For example, the second delay cell 500b would have the control terminal of its M1 transistor coupled to node Vo+ of the first delay cell 500a and the control terminal of its M2 transistor coupled to Vo- of the first delay cell 500a. A third delay cell (not shown), if provided, would have its M1 control terminal coupled to the output of the second delay cell 500b (i.e., node Vo+ of the second delay cell 500b) and the control terminal of its M2 transistor coupled to Vo- of the second delay cell 500b.

In operation, the amplifier 402 pulls node "C" of the delay cell of the replica bias stage 400 to the control voltage Vcon (i.e., to V2(t)). In each delay cell, the voltage applied to the control terminal of each voltage controlled resistor controls the impedance of the MOSFET devices (i.e., the MOSFETS coupled to "Bias" in FIGS. 12(a) and 12(b)), and thus the current into the voltage controlled resistor from node C for a given voltage at node C. By varying the voltage at node C, which is pulled to control voltage Vcon in the delay cell of the bias stage, the voltage controlled resistor exhibits different I-V characteristics. Each delay cell 500 provides a delay of a period td. Signal Vcon provided to the operational amplifier 402 controls the delay period td of each cell. Period td is directly proportional to Vcon. So, the instantaneous delay td changes with Vcon, thereby providing a spread spectrum output clock signal at node Vo+ of the last delay cell 500, if more than one delay cell 500 is provided. A second clock signal, which is 180° out-of-phase with the signal at Vo+, is also provided at Vo-. The spreading of the signal increases with the number of delay cells. In an exemplary embodiment, the circuit of FIG. 11 has 16 delay cells.

Per the foregoing, the delay time of the delay line is controlled by the control voltage V2(t) and is linearly related thereto. When delay time and the control voltage are not linearly related, the system may be limited to use with signals with small AC components. With signals with larger AC components, it is preferred that the delay time and control voltage be linearly related.

Figure 13:
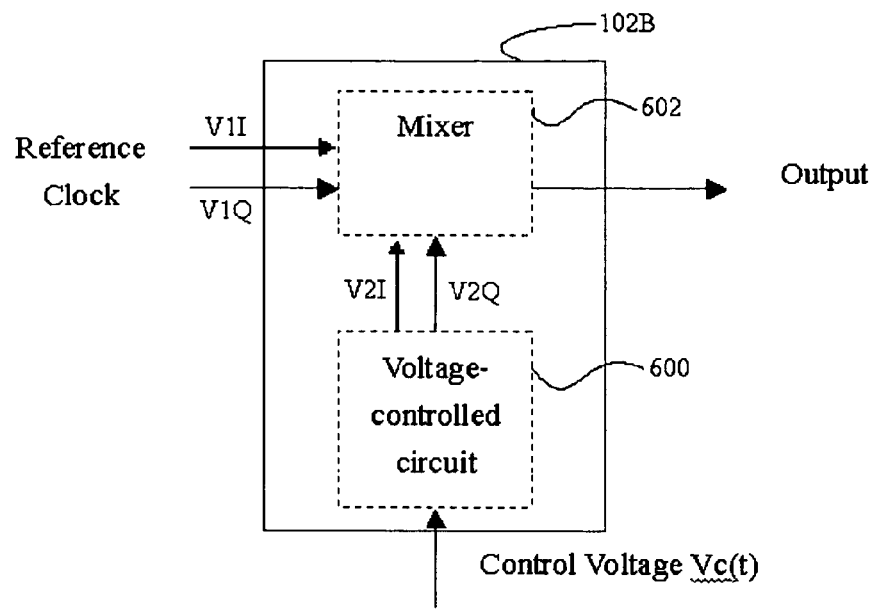
FIG. 13 is a block diagram of another alternative embodiment of a spread spectrum clock generator.

FIG. 13 is a block diagram of an alternative embodiment of a voltage controlled delay line 102B, which provides a spread spectrum output signal in response to a control voltage Vc(t) and reference clock signal. The control voltage and reference clock may be as described above in connection with FIGS. 3-7.

The mixer 602 receives two out-of-phase components of the reference clock signal, which are 90° out-of-phase in one embodiment, e.g., V1I=A1*cos(Wo·t) and V1Q=A1*sin(Wo·t). The function of voltage controlled circuit 604 is as follows: V2I=A2*cos(K*integral of Vc(t)) and V2Q=A2*sin(K*integral of Vc(t)). In one embodiment, the mixer 602 can be implemented as a multiplier, which should be familiar to those in the art. Therefore, Vout equals V1I*V2I+V1Q*V2Q.

Like the clock generator of FIG. 9, assuming for illustrative purposes that the reference clock conforms to the equation cos(Wo·t) (or sin(Wo·t+$\theta_o$)), (i.e., V1I and/or V1Q, then Vout(t)=A*cos(Wo·t−K*integral of V1(t)), wherein A is a constant. The output phase $\theta$(t) of the output signal equals Wo·t−K*integral of V1(t). Therefore, the instant output frequency W(t) (i.e., d$\theta$/dt)=Wo−K*V1(t), which defines a spread spectrum output clock signal.

Figure 15A:
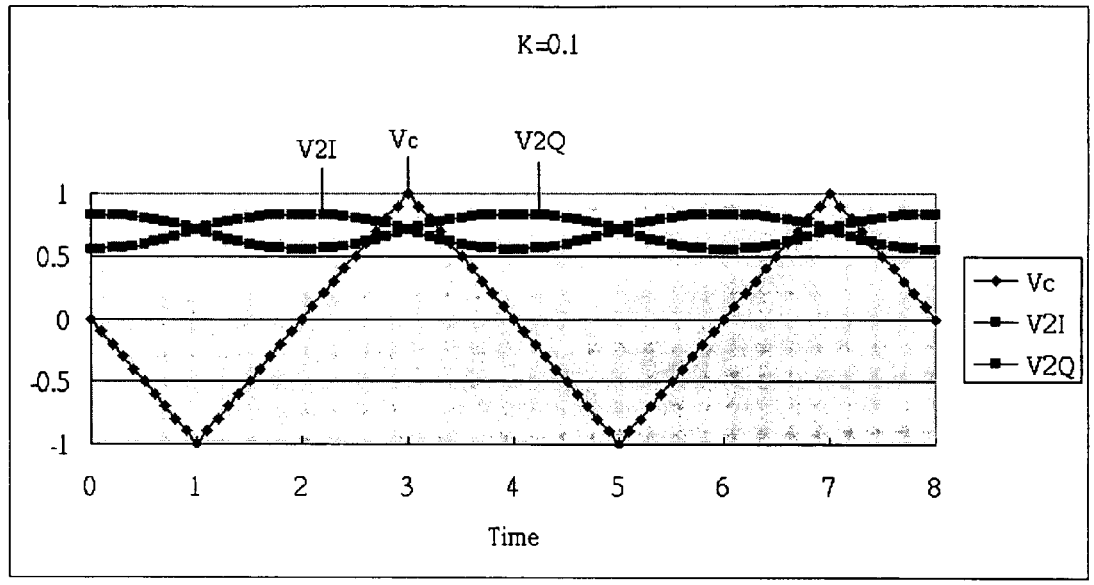
FIGS. 15(a)-15(c) are graphical illustration of signals shown in the block diagram of FIG. 13.
Figure 15B:
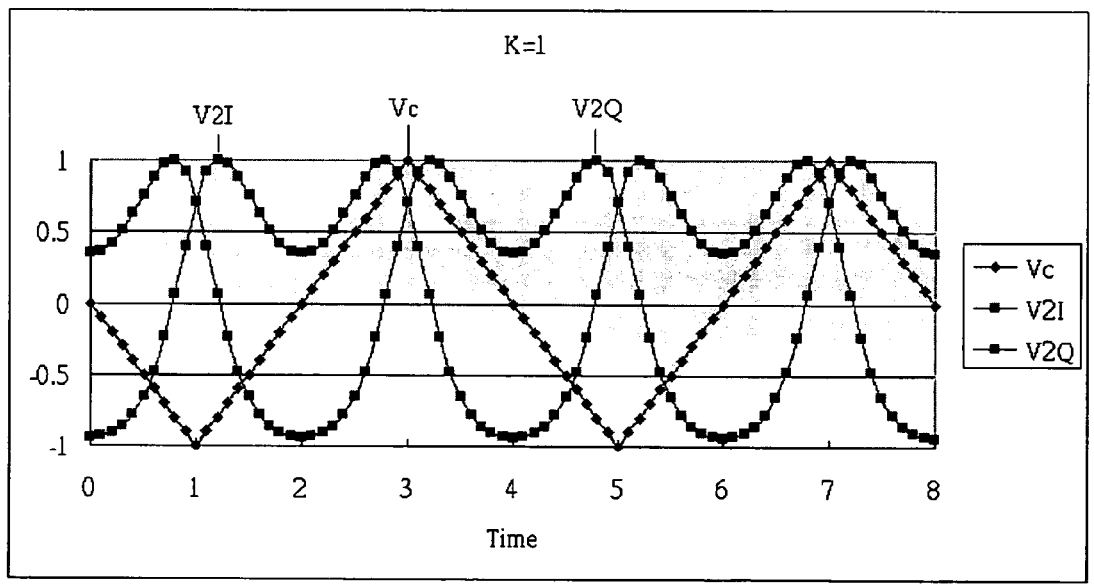
Figure 15C:
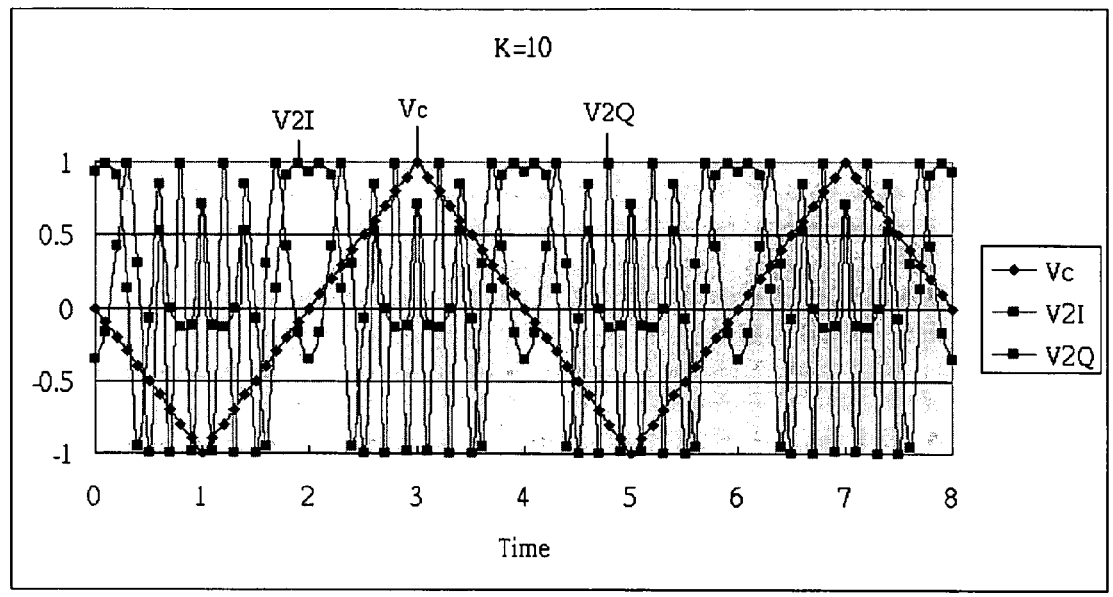

The voltage controlled circuit 600 may comprise a voltage controlled circuit familiar to those in the art. FIGS. 15(a)-15(c) are plots illustrating a mathematical simulation of the voltage controlled circuit 600, assuming a control voltage Vc(t) that is a triangle wave and K-values of 0.1, 1 and 10, respectively. As can be seen from the plots, the output phase signals V2I and V2Q produced by the voltage controlled circuit are largely dependent on the values of K. It can be seen that the higher the K value, the higher the slope of the V2I and V2Q curves. Therefore, as K increases, the amount of spreading increases.

Figure 14:
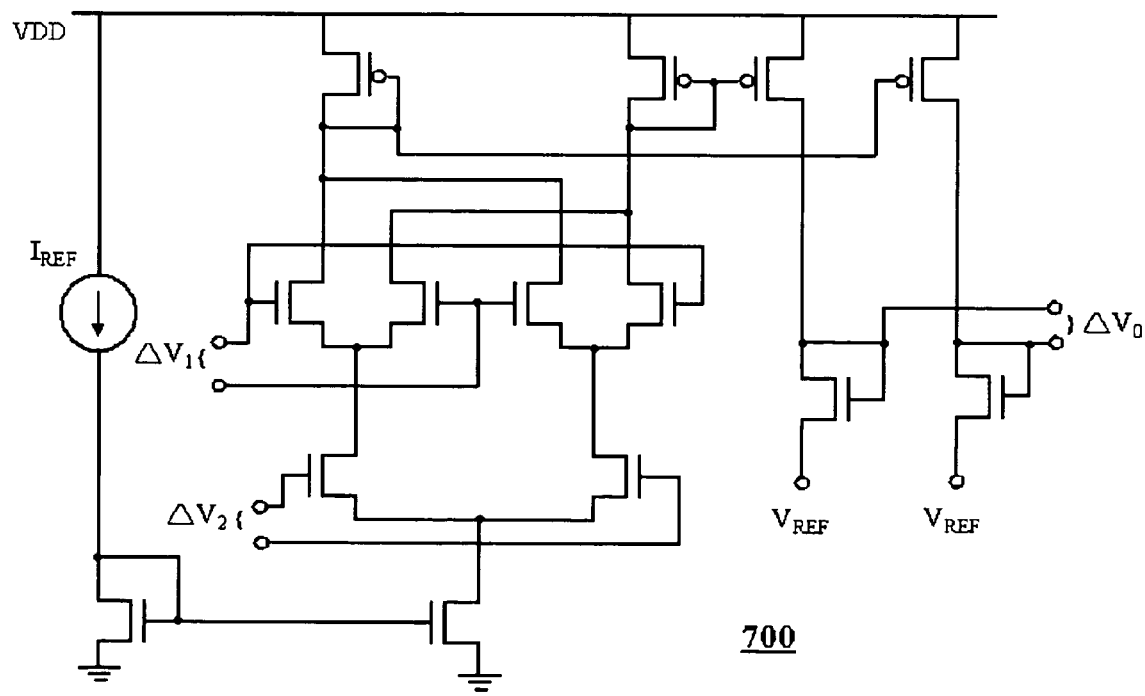
FIG. 14 is a circuit diagram of a Gilbert multiplier.

As noted above, the mixer 602 may comprise a multiplier. In one embodiment, the multiplier comprises a Gilbert Multiplier 700, as shown in FIG. 14. The operation of the Gilbert Multiplier 700 should be familiar to those in the art and its operation is not repeated in detail herein so as to avoid unnecessarily obscuring the disclosure of the present invention. In some embodiments, the NMOS transistors of the Gilbert Multiplier could be replaced with BJT transistors, such as when the Gilbert Multiplier utilizes biCMOS technology. In the illustrated embodiment, $\Delta$V1 is the difference between V1I and V1Q, and $\Delta$V2 is the difference between V2I and V2Q. The output signal is provided at $\Delta V_O$. Of course, other types of multipliers, besides Gilbert Multipliers, may also be used, as will familiar to those in the art.

In the embodiments described above in connection with FIGS. 3-12, the delay line has maximum and minimum delays that could be achieved, providing a practical limitation on the spreading amount ($\Delta$f/$f_0$ where $f_0$ is the center frequency) of the spread spectrum signal. The circuit delay line 102B of the clock generating circuit disclosed in FIG. 13, however, has no maximum and minimum delays, as the delay is between 0 and 2$\pi$. Without a maximum and minimum on the signal delay, there is no limit on the spread spectrum percentage.

Figure 16:
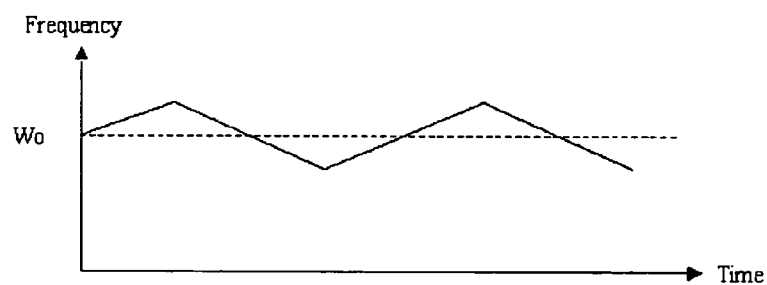
FIG. 16 is an illustrative plot of the frequency versus time of the output spread spectrum clock provided by the clock generators of FIGS. 9 and 13.

FIG. 16 shows an illustrative plot of the frequency of the spread spectrum clock signal provided by the circuits of FIGS. 9 and 13. As described above, the instantaneous frequencies conform to W(t)=Wo(t)−K*(V1(t)) for the embodiments of FIGS. 9 and 13. As can be seen from FIG. 16, the frequency W(t) of the clock signal changes with time around the center frequency Wo.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. An electronic device comprising a clock circuit for generating a spread spectrum clock signal, said clock circuit comprising:
   a voltage controlled delay line circuit, said delay line circuit providing a spread spectrum clock signal from a reference clock signal in response to a modulation signal, a delay of said delay line circuit being controlled by said modulation signal;
   a first integrator, said first integrator providing said modulation signal in response to a first input signal, wherein said first integrator comprises:
   an operational amplifier having a first input coupled to receive said first input signal, a second input coupled to a resistive load and an output coupled to said resistive load to provide a current signal proportional to said first input signal; and
   a first capacitive load.

2. The electronic device of claim 1, wherein said first input signal is a triangle wave.

3. The electronic device of clam 1, wherein said clock circuit further comprises a second integrator, said second integrator providing said first input signal in response to a second input signal.

4. The electronic device of claim 1, wherein said clock circuit further comprises:
   means for removing a DC component from said current signal, thereby producing an output current signal for driving said capacitive load.

5. The electronic device of claim 1, wherein said clock circuit further comprises a second integrator, said second integrator providing said first input signal from a second input signal, said second integrator comprising a pair of counter-operating switches coupled between an input node for receiving said second input signal and a second capacitive load.

6. The electronic device of claim 5, wherein said pair of switches comprises a pair of drain coupled MOS transistors having control terminals coupled to receive said second input signal.

7. The electronic device of claim 1, wherein said delay line comprises at least a first differential delay cell having an input for receiving a clock signal and a delay controlled by a bias signal.

8. The electronic device of claim 7, wherein said first differential delay cell comprises a source-coupled transistor pair with voltage-controlled resistor (VCR) load elements coupled to receive said bias signal.

9. The electronic device of claim 8, wherein said delay line further comprises a plurality of differential delay cells coupled in series to an output of said first differential delay cell, each of said plurality of differential delay cells being further coupled to receive said bias signal.

10. The electronic device of claim 8, wherein said delay line further comprises a replica bias stage, comprising:
    a delay cell comprising a source-coupled transistor pair with voltage-controlled VCR load elements coupled to receive said bias signal; and
    an operational amplifier coupled to provide said bias signal responsive to said modulation control signal.

11. A method of generating a spread spectrum clock signal, comprising the steps of:
    integrating a first input signal with a first integrator to provide a modulation signal, said first integrator comprising an operational amplifier having a first input coupled to receive said first input signal, a second input coupled to a resistive load and an output coupled to said resistive load to provide a current signal proportional to said first input signal, and a first capacitive load; and providing a series of reference clock pulses to a voltage controlled delay line circuit, a delay of said delay line circuit being controlled by said modulation signal, to provide a spread spectrum clock signal from said series of clock pulses.

12. The method of claim 11, wherein said modulation signal is a triangle wave.

13. The method of claim 12, further comprising the step of integrating a second input signal to provide said first input signal.

14. The method of claim 11, wherein said delay line comprises at least a first differential delay cell having an input for receiving a clock signal and a delay controlled by a bias signal.

15. The electronic device of claim 14, wherein said first differential delay cell comprises a source-coupled transistor pair with voltage-controlled resistor (VCR) load elements coupled to receive said bias signal.

16. The electronic device of claim 14, wherein said delay line further comprises a plurality of differential delay cells coupled in series to an output of said first differential delay cell, each of said plurality of differential delay cells being further coupled to receive said bias signal.

17. The method of claim 14, further comprising the step of producing said bias signal from said modulating signal.

18. An electronic device comprising a clock circuit for generating a spread spectrum clock, said clock circuit comprising:

a voltage controlled delay line circuit for providing a spread spectrum clock signal from a reference clock signal in response to a modulation signal, said delay line circuit comprising a plurality of differential delay cells coupled in series, each of said delay cells having a voltage-controlled resistor load coupled to receive said bias signal, wherein a delay of each differential delay cell is controlled by said bias signal and is linearly related thereto;

means for producing said bias signal responsive to said modulation signal;

a first integrator, said first integrator providing said modulation signal in response to a first input signal, wherein said first integrator comprises an operational amplifier having a first input coupled to receive said first input signal, a second input coupled to a resistive load and an output coupled to said resistive load to provide a current signal proportional to said first input signal, and a first capacitive load; and a second integrator, said second integrator providing said first input signal in response to a second input signal.

* * * * *